United States Patent
Byom et al.

(10) Patent No.: US 8,456,938 B2
(45) Date of Patent: Jun. 4, 2013

(54) SYSTEMS AND METHODS FOR REFRESHING NON-VOLATILE MEMORY

(75) Inventors: Matthew J. Byom, San Jose, CA (US); Daniel J. Post, Campbell, CA (US); Vadim Khmelnitsky, Foster City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/419,567

(22) Filed: Mar. 14, 2012

(65) Prior Publication Data
US 2012/0236658 A1    Sep. 20, 2012

Related U.S. Application Data

(63) Continuation of application No. 12/730,617, filed on Mar. 24, 2010, now Pat. No. 8,164,967.

(51) Int. Cl.
*G11C 7/00*    (2006.01)

(52) U.S. Cl.
USPC ..................... 365/222; 365/185.25

(58) Field of Classification Search
USPC .............................. 365/222, 185.25
See application file for complete search history.

(56) References Cited

U.S. PATENT DOCUMENTS

| | | | |
|---|---|---|---|
| 7,317,632 B2 * | 1/2008 | Chen et al. | 365/185.08 |
| 7,535,787 B2 | 5/2009 | Elmhurst et al. | |
| 7,551,486 B2 | 6/2009 | Cornwell et al. | |

* cited by examiner

*Primary Examiner* — Son Dinh
*Assistant Examiner* — Nam Nguyen
(74) *Attorney, Agent, or Firm* — Van Court & Aldridge LLP (57) ABSTRACT

Systems and methods are disclosed for managing a non-volatile memory ("NVM"), such as a flash memory. To prevent data errors due to leakage effects, the NVM may be refreshed. For example, a reserved portion of the NVM may be selected, and a predetermined pattern can be stored into the reserved portion. The reserved portion can then be monitored for storage deterioration over time. After determining that storage deterioration of the reserved portion has occurred, the NVM can be refreshed. In some embodiments, a controller can attempt to distinguish data errors due to leakage effects from data errors due to disturb issues.

15 Claims, 5 Drawing Sheets

FIG. 5

SYSTEMS AND METHODS FOR REFRESHING NON-VOLATILE MEMORY

CROSS-REFERENCE TO RELATED APPLICATIONS

This application is a continuation of U.S. patent application Ser. No. 12/730,617 filed Mar. 24, 2010, which is hereby incorporated by reference herein in its entirety.

FIELD OF THE INVENTION

This can relate to systems and methods for refreshing a non-volatile memory, such as flash memory.

BACKGROUND OF THE DISCLOSURE

NAND flash memory, as well as other types of non-volatile memories ("NVMs"), is commonly used for mass storage. For example, consumer electronics such as portable media players or cellular telephones often include raw flash memory or a flash card to store music, videos, and other media.

Non-volatile memories, such as NAND flash memory, can include memory cells capable of storing one or more bits of information as electric charge. Gradually, however, these memory cells may suffer leakage effects as the level of stored electric charge changes. As a result of these leakage effects, data stored in these memory cells may become less reliable over time.

SUMMARY OF THE DISCLOSURE

Systems and methods are disclosed for refreshing a non-volatile memory, such as flash memory (e.g., NAND flash memory).

A memory system may be provided which can include a host, such as a portable media player or a cellular telephone, and a non-volatile memory ("NVM") of any suitable type. For example, the host may include a host processor for controlling and managing the memory locations of the NVM and the data stored therein. The NVM can include flash memory, such as one or more NVM dies (e.g., flash dies). Optionally, the NVM may be packaged with a NVM controller, and therefore the NVM may be a managed NVM (e.g., managed NAND) or a raw NVM (e.g., raw NAND).

In some embodiments, a NVM can be organized into one or more "blocks" that may be further organized into a sequence of "pages". In order to detect data errors due to leakage effects in a NVM, a controller (e.g., a host processor and/or a NVM controller) may be configured to refresh the NVM. A "refresh" operation can refer to a series of actions whereby the controller may copy some amount of data from one location of a NVM to another location. For example, the controller can refresh by first selecting a portion of the NVM as a reserved portion. In some embodiments, the controller can select a predetermined number of blocks from each die as the reserved portion. In other embodiments, the controller can select a predetermined number of pages from each die as the reserved portion. For example, the controller can select pages that minimizes disturb issues (e.g., read/program/erase disturb) and/or pages with a higher probability of data errors.

After selecting the reserved portion, the controller can store a predetermined pattern into the reserved portion. The controller can then monitor the reserved portion for storage deterioration over time. In some embodiments, the controller can poll the reserved portion based on the occurrence of one or more events associated with a portion of the NVM. The one or more events may be time-independent. That is, the occurrence of the one or more events may be independent of the time elapsed since a previous occurrence of the one or more events. For example, the one or more events can include any suitable event such as a predetermined number of read operations of the portion of the NVM, a power-on event, a wake-up event, any other suitable event, and/or any combination thereof.

As another example, the one or more events can include an uncorrectable event of a portion of the NVM detected using one or more error correcting codes. In further embodiments, the one or more events may correspond to time periods when the NVM is operating in a specific mode (e.g., an idle mode) and/or while the controller is performing wear leveling.

In response to determining that the one or more events have occurred, the controller can poll the reserved portion and determine whether the reserved portion has deteriorated. After determining that storage deterioration of the reserved portion has occurred, the controller can refresh the NVM. In some embodiments, the controller can refresh the NVM by refreshing multiple portions (e.g., one or more blocks) of the NVM in a predetermined order (e.g., an order determined based on age rankings and/or an order determined based on physical addresses).

In some embodiments, in addition to refreshing the NVM, the controller may select another portion of the NVM as a new reserved portion. The controller may select the new reserved portion based on one or more suitable factors. For example, the controller may select the new reserved portion based on a high likelihood that a portion may have data errors due to leakage effects. The likelihood that a portion may have an increased number of data errors may be due to one or more factors, such as, for example, a high number of access operations (e.g., read, program, and/or erase operations), failure of one or more tests, stored data with an age greater than a particular threshold, and/or any combination thereof.

In some embodiments, the controller can refresh the new reserved portion prior to refreshing any other portion of the NVM. As a result, the controller can reprogram the new reserved portion as soon as the new reserved portion has been refreshed. For example, as soon as the new reserved portion has been refreshed and prior to refreshing the remaining portions of the non-volatile memory, the controller can store the predetermined pattern into the new reserved portion. By reprogramming the new reserved portion first, the controller can ensure that the new reserved portion has the oldest data in the NVM, such that the new reserved portion will likely begin to suffer leakage effects first. In some cases, the controller can refresh the remaining portions of the non-volatile memory based on any suitable ranking (e.g., rankings determined based on age of data stored in the remaining portions). In other embodiments, a controller can attempt to distinguish data errors due to leakage effects from data errors due to disturb issues.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
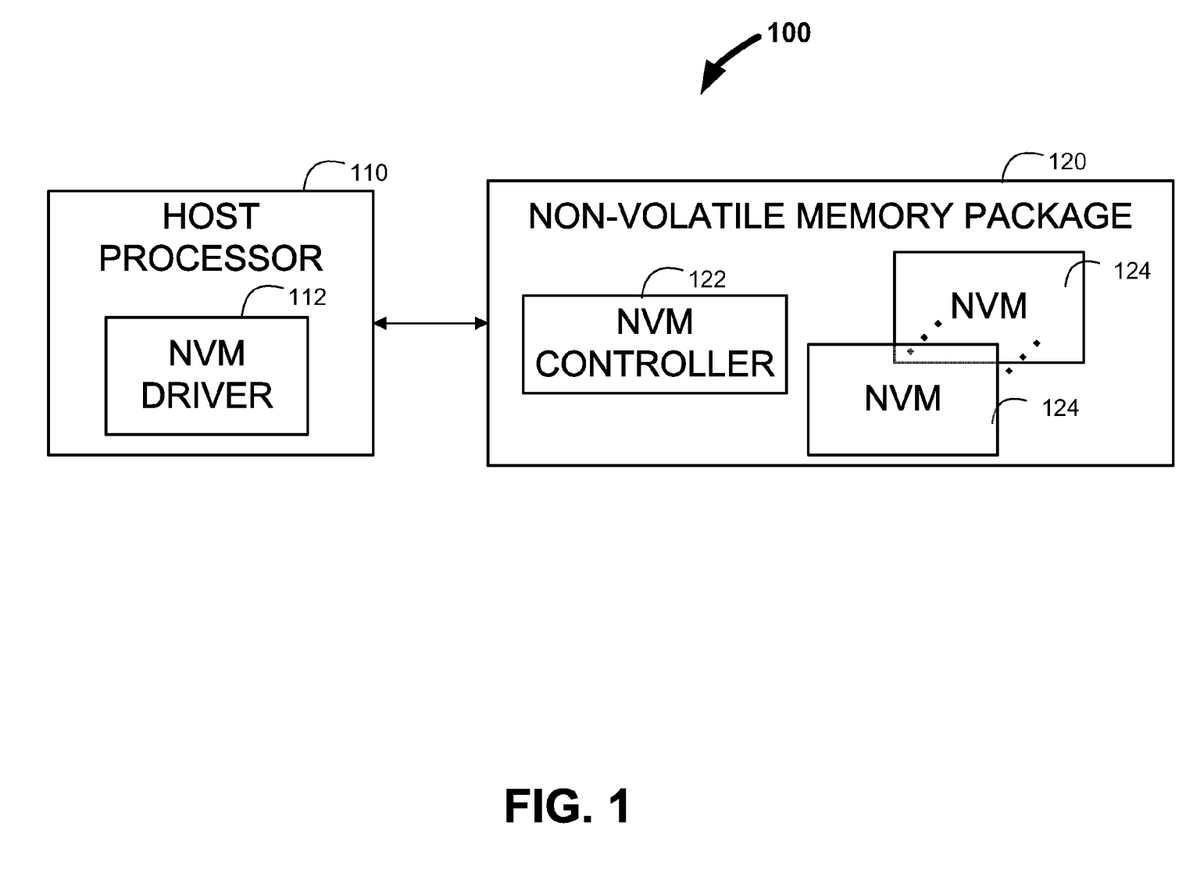
FIG. 1 is a schematic view of an illustrative memory system including a host processor and a non-volatile memory package configured in accordance with various embodiments of the invention.

FIG. 1 is a schematic view of memory system 100. Memory system 100 can include host processor 110, and at least one non-volatile memory ("NVM") package 120. Host processor 110 and optionally NVM package 120 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer. For simplicity, the host device or system, which may include host processor 110, may sometimes be referred to simply as a "host".

Host processor 110 can include one or more processors or microprocessors that are currently available or will be developed in the future. Alternatively or in addition, host processor 110 can include or operate in conjunction with any other components or circuitry capable of controlling various operations of memory system 100 (e.g., application-specific integrated circuits ("ASICs")). In a processor-based implementation, host processor 110 can execute firmware and software programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 110 can execute NVM driver 112, which may provide vendor-specific and/or technology-specific instructions that enable host processor 110 to perform various memory management and access functions for non-volatile memory package 120.

NVM package 120 may be a ball grid array ("BGA") package or other suitable type of integrated circuit ("IC") package. NVM package 120 may be a managed NVM package or a raw NVM package. In a managed NVM implementation, NVM package 120 can include NVM controller 122 coupled to any suitable number of NVM dies 124. NVM controller 122 may include any suitable combination of processors, microprocessors, or hardware-based components (e.g., ASICs), and may include the same components as or different components from host processor 110. NVM controller 122 may share the responsibility of managing and/or accessing the physical memory locations of NVM dies 124 with NVM driver 112. Alternatively, NVM controller 122 may perform substantially all of the management and access functions for NVM dies 124. Thus, a "managed NVM" may refer to a memory device or package that includes a controller (e.g., NVM controller 122) configured to perform at least one memory management function for a non-volatile memory (e.g., NVM dies 124).

In a managed NVM implementation, host processor 110 can communicate with NVM controller 122 using any suitable communications protocol, such as a suitable standardized inter-processor protocol. For example, NVM package 120 may be included in a memory card (e.g., flash card), and host processor 110 and NVM controller 122 may communicate using Multimedia Memory Card ("MMC") or Secure Digital ("SD") card interfaces. In other embodiments, NVM package 120 may be included in a Universal Serial Bus ("USB") memory drive, and host processor 110 and NVM controller 122 may communicate via a USB protocol.

In some embodiments, non-volatile memory package 120 may be a raw NVM package. In these embodiments, NVM package 120 may not include NVM controller 122, and NVM dies 124 may be managed substantially completely by host processor 110 (e.g., via NVM driver 112). Thus, a "raw NVM" may refer to a memory device or package that may be managed entirely by a host controller or processor (e.g., host processor 110) implemented external to the NVM package.

NVM dies 124 may be used to store information that needs to be retained when memory system 100 is powered down. As used herein, and depending on context, a "non-volatile memory" can refer to NVM dies in which data can be stored, or may refer to a NVM package that includes the NVM dies. NVM dies 124 can include NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), any other known or future types of non-volatile memory technology, or any combination thereof. FIG. 1, as well as later figures and various disclosed embodiments, may sometimes be described in terms of using flash technology. However, this is merely illustrative and not intended to be limiting.

The memory locations in NVM dies 124 can each be organized into one or more "planes". The different planes can concurrently carry out access operations to its memory locations (e.g., program, read, and erase operations). The memory locations of each plane may be organized into "blocks" that may each be erasable at once, with its blocks further organized into a sequence of "pages" that may each be programmable and readable at once.

Figure 2:
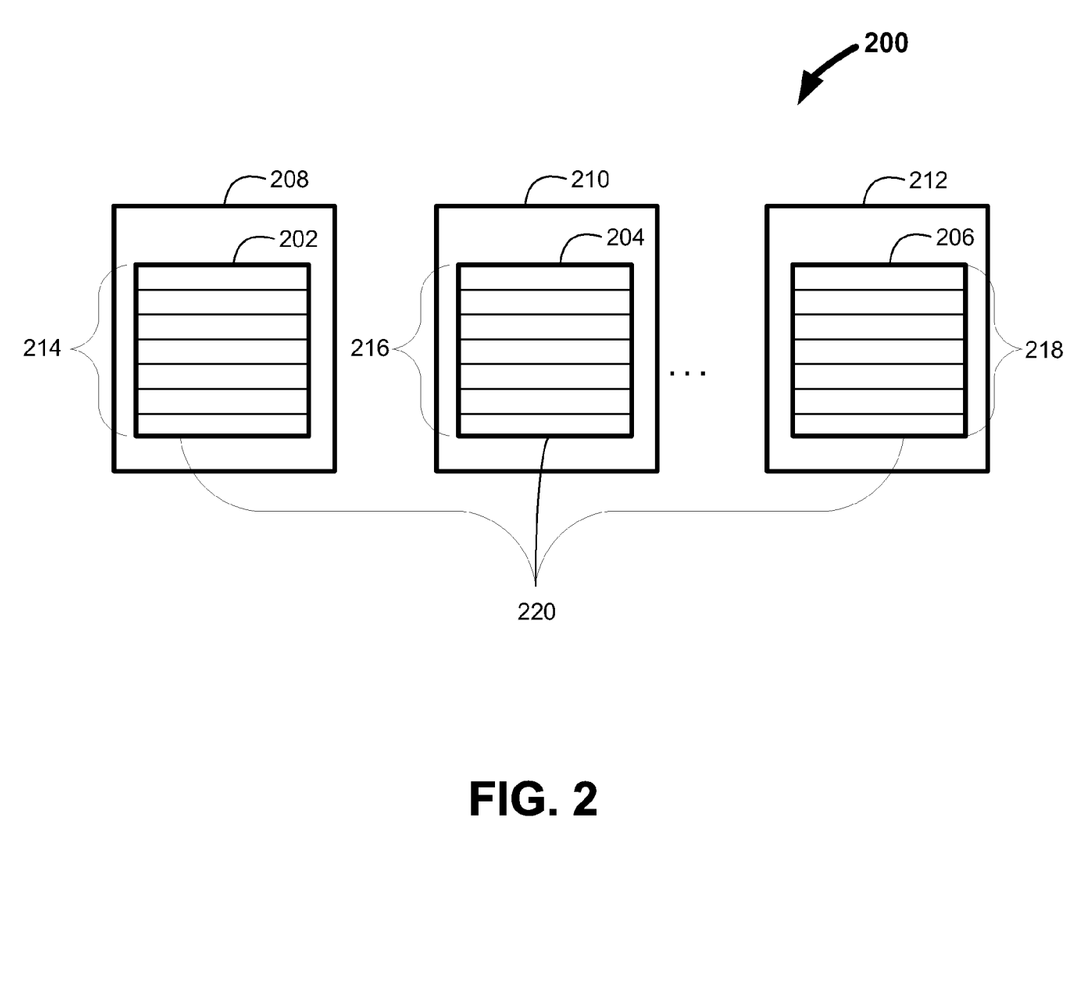
FIG. 2 is a block diagram of an illustrative portion of a non-volatile memory configured in accordance with various embodiments of the invention.

For example, FIG. 2 shows an exemplary block diagram of memory locations within a package 200. Package 200 may be a more detailed view of some components in NVM package 120 of FIG. 1. Package 200 can include one or more non-volatile memory dies. As shown in FIG. 2, for example, package 200 can include dies 208, 210, and 212, which (for simplicity) are each illustrated as having a single plane. Dies 208, 210, and 212 may include blocks 202, 204, and 206, respectively. Persons skilled in the art will appreciate that each of NVM dies 208, 210, and 212 can include any suitable number of blocks. For the sake of simplicity, however, only one block is shown for each NVM die in FIG. 2.

Each block can include one or more pages. For example, as shown in FIG. 2, blocks 202, 204, and 206 can include pages 214, 216, and 218, respectively. In some embodiments, corresponding blocks from multiple NVM dies (e.g., one block from each of NVM dies 208, 210, and 212 having the same position or block number) may form logical storage units referred to as "super blocks". As shown, super block 220 may represent one such super block.

Referring back to FIG. 1, a block in any of NVM dies 124 can physically include an array of memory cells aligned in rows corresponding to word lines. The memory cells of a block may be configured as single-level cells ("SLC") or multi-level cells ("MLC"), and each word line in the block may be configured for use in storing one page (in a SLC case) or multiple pages (in a MLC case). Thus, the number of pages in a given block may be based on the number of bits stored per memory cell. Due to the increased density of storage, a block being used as a 2-bit MLC block may include twice the number of pages as when the same block is being used as an SLC block. As an example, each memory cell of a 2-bit MLC block may include a lower page and an upper page, where each of the lower and upper pages can be used to store a single bit.

In some embodiments, for a block composed of 64 word lines, the block may include 64 pages when used as a SLC block, 128 pages when used as a 2-bit MLC block, 192 pages when used as a 3-bit MLC block, and so on. These numbers, however, are merely illustrative and a block of NVM dies 124 may include any other suitable number of pages. Also, NVM dies 124 can include any suitable number of dies, planes, and blocks, and for MLC embodiments, any suitable number of bits per cell may be implemented.

As discussed above, host processor 110 (e.g., via NVM driver 112) and optionally NVM controller 122 may be configured to perform memory management and access functions for NVM dies 124. This way, host processor 110 and/or NVM controller 122 can manage the memory locations (e.g., super blocks, pages, blocks, and planes) of NVM dies 124 and the information stored therein. The memory management and access functions may include issuing read, program, or erase instructions and performing wear leveling, bad block management, garbage collection, logical-to-physical address mapping, SLC or MLC programming decisions, and data queuing to set up program operations. As described in greater detail below, the memory management and access functions may further include refresh operations. A "refresh" operation may refer to a series of actions whereby a controller (e.g., via host processor 110 or NVM controller 122) copies some amount of data from one location of a non-volatile memory (e.g., a first die of NVM dies 124) to another location of the non-volatile memory (e.g., a second die of NVM dies 124).

A memory cell of a block in any of NVM dies 124 may suffer leakage effects as the level of electric charge that is stored in the memory cell changes over time. Thus, by performing refresh operations to transfer data from one location to another, the electric charge for the newly stored version of the data may be restored to appropriate levels. In some embodiments, host processor 110 and/or NVM controller 122 may be configured to refresh a non-volatile memory by first detecting a condition indicating that a refresh operation may be needed. For example, host processor 110 and/or NVM controller 122 may select a portion of the non-volatile memory as a reserved portion and store a predetermined pattern into the reserved portion. Then, host processor 110 and/or NVM controller 122 can monitor the reserved portion for storage deterioration over time. In other words, host processor 110 and/or NVM controller 122 can monitor the reserved portion to determine the extent of any leakage effects and may use this information to determine when to initiate a refresh operation. Responsive to determining that storage deterioration of the reserved portion has occurred, host processor 110 and/or NVM controller 122 can refresh the non-volatile memory.

Figure 3:
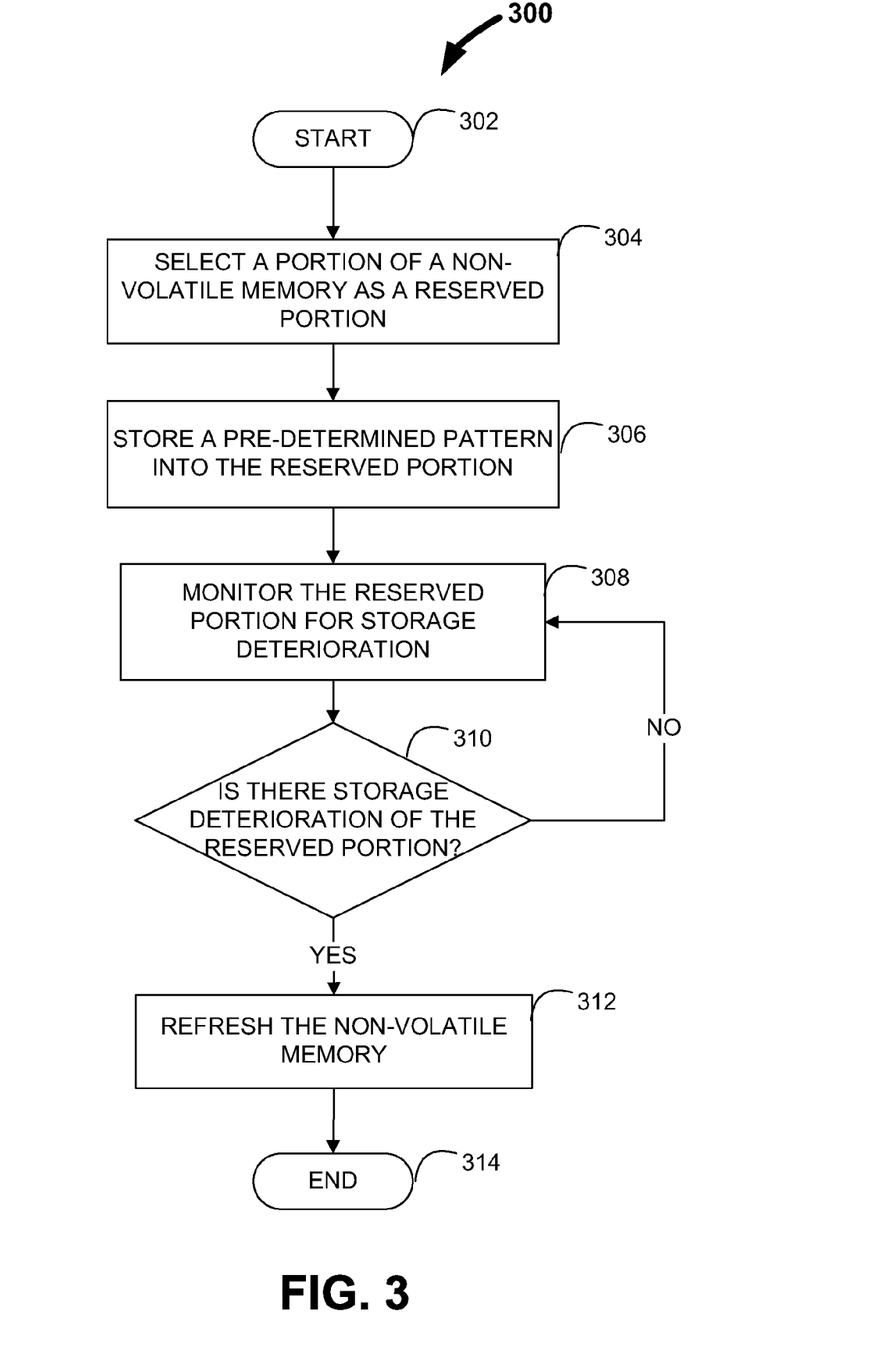
FIG. 3 is a flowchart of an illustrative process for refreshing a non-volatile memory in accordance with various embodiments of the invention.
Figure 4:
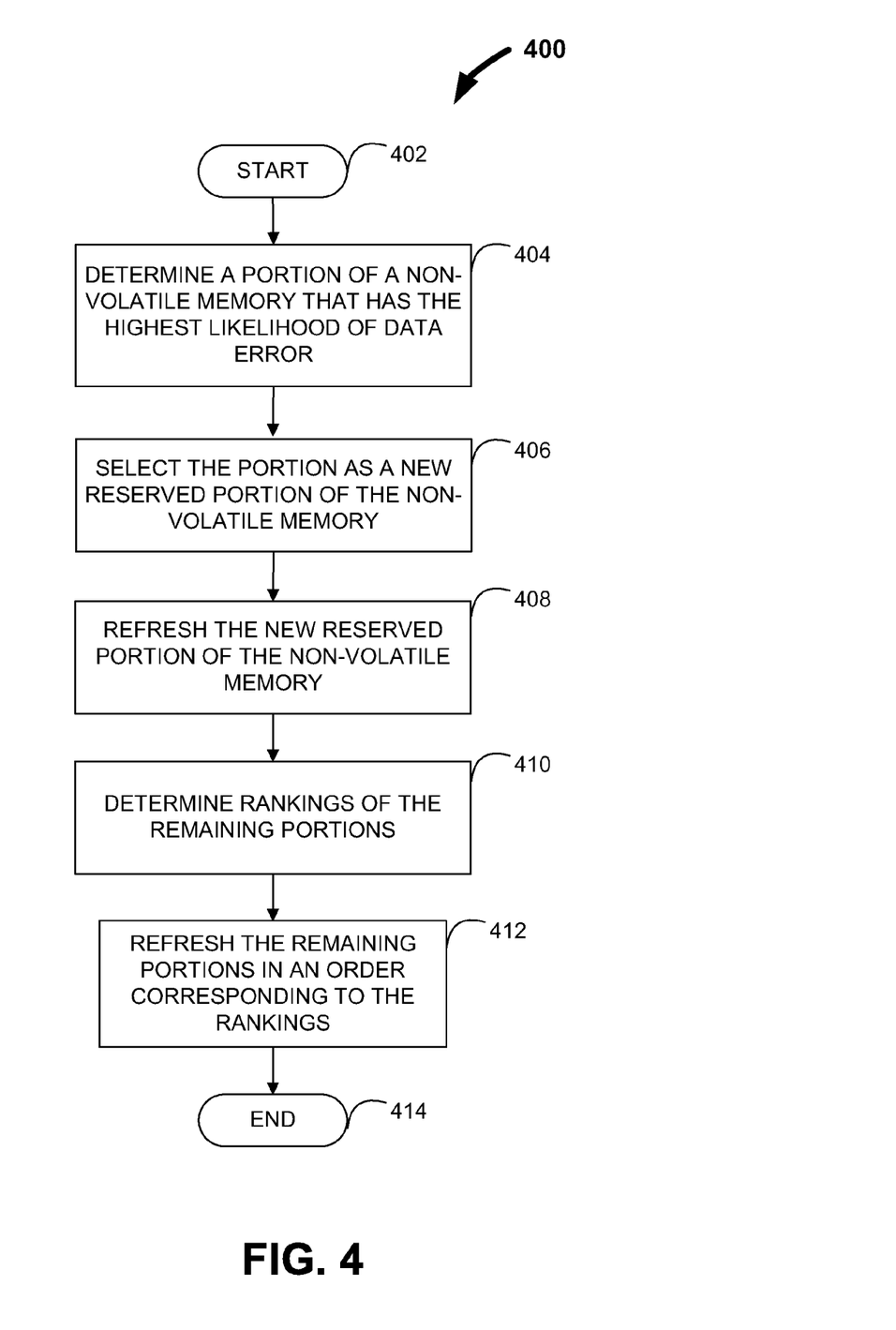
FIG. 4 is a flowchart of an illustrative process for refreshing multiple portions of a non-volatile memory in accordance with various embodiments of the invention.
Figure 5:
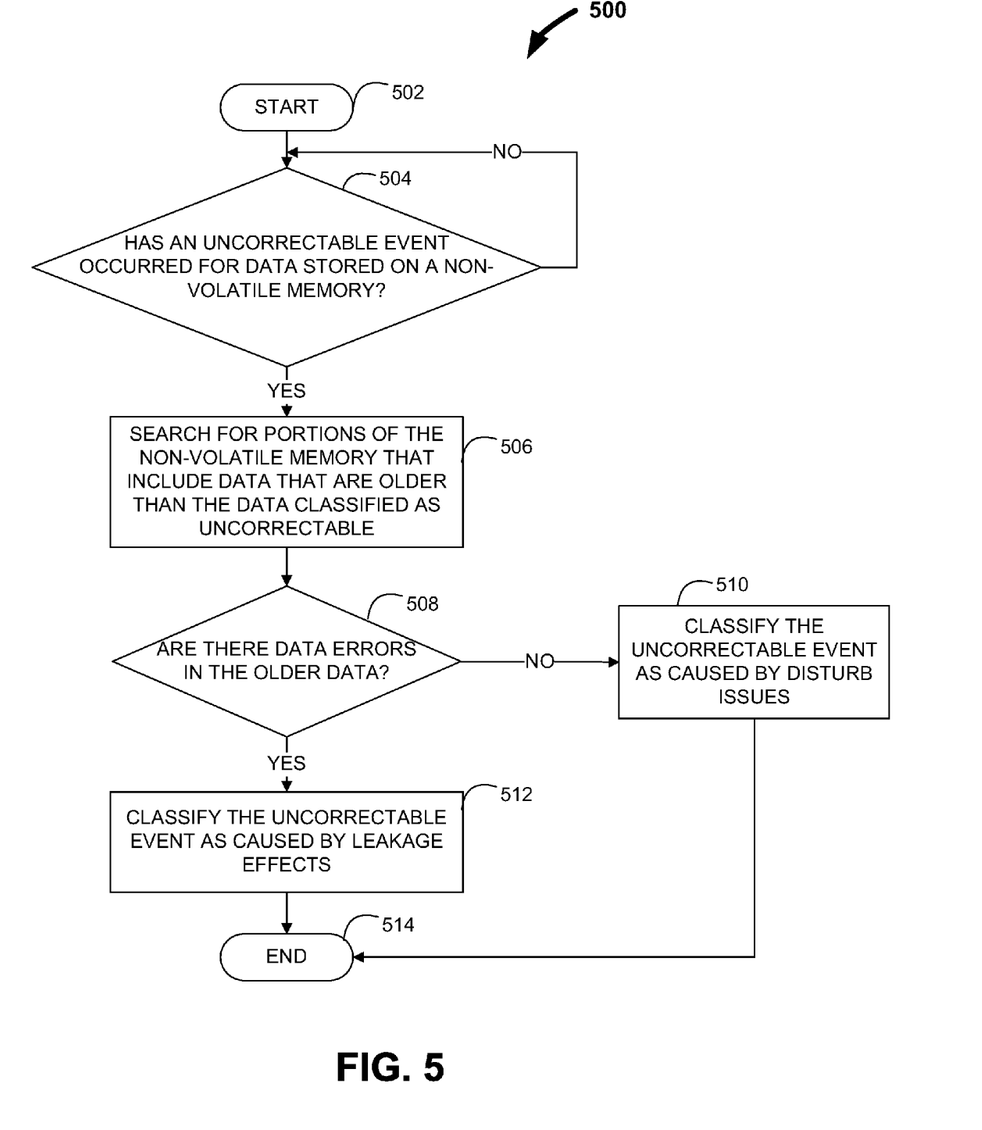
FIG. 5 is a flowchart of an illustrative process for distinguishing data errors due to leakage effects from data errors due to disturb issues in accordance with various embodiments of the invention.

Referring now to FIGS. 3-5, flowcharts of illustrative processes are shown for refreshing a non-volatile memory (e.g., one or more NVM dies 124 or NVM package 120 of FIG. 1). The steps of these processes may be executed by one or more components in a memory system (e.g., memory system 100 of FIG. 1). For example, a host processor (e.g., host processor 110 of FIG. 1) and/or a NVM controller (e.g., NVM controller 122 of FIG. 1) may execute the steps, but it should be understood that any other suitable component(s) in a memory system may be configured to perform these steps. As used hereinafter, the host processor and the NVM controller will be referred to as "controller".

Turning first to FIG. 3, a flowchart of illustrative process 300 is shown for refreshing a non-volatile memory. Process 300 may begin at step 302. Then, at step 304, the controller may select a portion of a non-volatile memory as a reserved portion. The controller can select any suitable portion of the non-volatile memory as the reserved portion such as, for example, one or more dies, one or more blocks, one or more pages, any other suitable portion of the non-volatile memory, and/or any combination thereof.

In some embodiments, because each die of the non-volatile memory may suffer from leakage effects, the controller can select a predetermined number of blocks from each die (e.g., blocks 202, 204, and/or 206 of FIG. 2) as a reserved portion. A die may be, for example, a die of NVM dies 124 or NVM package 120 of FIG. 1 or a die of NVM dies 208, 210, and 212 of FIG. 2. In some embodiments, because each die of the non-volatile memory may be physically separate from other dies, the controller can select one block of each die as the reserved portion. Thus, for instance, the controller can select a block located at the same position of each die (e.g., a super block such as super block 220 of FIG. 2). Alternatively, the controller can assume that an increase of erase operations of a block may increase the probability that the block will suffer from leakage effects. Thus, for each die, the controller can monitor the number of erase operations of each block of the die. The controller can then select the block that has the highest number of erase operations. In another implementation, the controller can assume that a block with a higher sequence counter may increase the probability that the block will suffer from leakage effects. Thus, the controller can monitor sequence counters of the blocks of a die. The controller can then select the block that has the highest sequence counter as a reserved portion.

As another example, the controller can select a set of blocks as the reserved portion for each die. For instance, each block of the set of blocks can have a different number of erase operations and/or sequence counters. As a result, the controller can monitor the leakage effects across multiple blocks with different possible levels of storage deterioration. As yet another example, the controller can randomly select one or more blocks for each die.

In other embodiments, the controller can select a predetermined number of pages (e.g., pages 214, 216, and/or 218 of FIG. 2) from each die as the reserved portion. For example, the controller can randomly select one or more pages for each die. However, because pages neighboring the one or more pages may be used to store user data, using the one or more pages for refreshing purposes may potentially damage the user data stored in the neighboring pages. As another example, the controller can select pages that may minimize disturb issues (e.g., read/program/erase disturb), which can result when one operation affects the content of previously stored data in nearby memory cells of a block. For instance, neighboring pages of a block may be more susceptible to disturb issues than pages that are located further away from one another. Thus, the controller may select pages for the reserved portion that are located further away from pages that include user data.

In further embodiments, the controller can select one or more pages that may have a higher probability of data errors as the reserved portion. For example, the controller can select one or more pages located near the end of each block because pages located near the end of a block may be more susceptible to error-causing phenomena than other pages of the block. As another example, leakage effects of one or more pages of a MLC block may create more data errors as compared to other pages of the block. For instance, the upper pages of a 2-bit MLC block may create more data errors than the lower pages of the 2-bit MLC block. Thus, the controller can select one or more upper pages of the block as the reserved portion.

In some embodiments, the controller can determine which pages may have a higher probability of error based on the results of a test performed on the memory system. For instance, the test may be run during the manufacturing process of the non-volatile memory or a host. By running the test and determining which pages failed the test, the controller can identify which pages in each block may be more susceptible to error. In response to identifying one or more pages of a block that may be more susceptible to error, the controller can select the pages as the reserved portion. It will be understood that the approaches provided in these examples are merely illustrative, and the controller can use any single approach or any combination of approaches to select the reserved portion After selecting the reserved portion, at step 306, the controller can store a predetermined pattern into the reserved portion. For example, the predetermined pattern can be a worst-case pattern that is most susceptible to leakage effects (e.g., where the data bits flip more readily due to leakage). Persons skilled in the art will appreciate that any suitable predetermined pattern can be stored into the reserved portion.

Then, at step 308, the controller can monitor the reserved portion for storage deterioration. In some embodiments, the controller can poll the reserved portion based on the occurrence of one or more events associated with a portion of the non-volatile memory. In some cases, the one or more events may be time-independent. That is, the occurrence of the one or more events may be independent of the time elapsed since a previous occurrence of the one or more events. For example, the one or more events can include any suitable event such as a predetermined number of operations (e.g., 10,000 read operations) of the portion of the non-volatile memory, a power-on event, a wake-up event, any other suitable event, and/or any combination thereof.

In some embodiments, the one or more events can include an uncorrectable event of the portion of the non-volatile memory. For example, the memory system can use one or more error correcting codes to protect data stored in the portion of the non-volatile memory. The number of errors that can be detected using the error correcting codes may be greater than the number of errors that can be corrected using the error correcting codes. Thus, an uncorrectable event of the portion of the non-volatile memory may be an error that has been detected using the error correcting codes but cannot be corrected.

In other embodiments, the one or more events may correspond to time periods when the controller is operating in a specific mode. For example, the controller can determine that the one or more events have occurred when the controller is operating in an idle mode (e.g., when the controller is not performing read, program, or erase operations). As another example, the controller can determine that the one or more events have occurred when the controller is performing wear leveling. In further embodiments, the controller can determine that the one or more events have occurred when the controller is reading programs (e.g., firmware and software programs) stored in the memory of a host.

In response to determining that the one or more events have occurred, the controller can poll the reserved portion. For example, the controller can detect the bit flip growth (e.g., the increase in the number of bit flips) of the predetermined pattern that is stored in the reserved portion.

Continuing to step 310, the controller can determine if there is storage deterioration of the reserved portion. For example, the controller can determine if the number of bit flips has exceeded a predetermined threshold. If, at step 310, the controller determines that the number of bit flips has not exceeded the predetermined threshold, the controller can return to step 308, where the controller can continue to monitor the reserved portion for storage deterioration.

If, at step 310, the controller instead determines that the number of bit flips has exceeded the predetermined threshold, the controller can continue to step 312.

At step 312, the controller can refresh the non-volatile memory at any suitable time. For example, in order to minimize disruptions to other operations that may access the non-volatile memory, the controller can select to refresh the non-volatile memory during an idle mode. For instance, the controller can detect the idle mode by determining a period of time when the controller is not performing read, program, or erase operations.

In some embodiments, the controller can refresh the non-volatile memory by refreshing multiple portions (e.g., one or more blocks of a die) of the non-volatile memory in a predetermined order. For example, in order to refresh a block of a first die of the non-volatile memory, the controller can read the data stored in the block. The controller can then reprogram the data in a block of a second die of the non-volatile memory. After reprogramming the data, the controller can erase the data stored in the block of the first die.

The controller may use any suitable predetermined order to refresh the multiple portions of the non-volatile memory. For example, for a particular die, the predetermined order may correspond to one or more rankings of the blocks of the die. For instance, the controller can determine the rankings based on the age of data stored on each block. In some embodiments, because older data may be more likely to suffer from leakage effects, the controller can determine the rankings based on decreasing age. Thus, as an example, the controller can determine the age of data stored on each block based on pages associated with the block. For example, each page of a block may include metadata providing information that can be used for managing the page. In some embodiments, the metadata can include generation numbers indicative of the age of data stored on a page. Accordingly, the controller can assign rankings to the blocks based on the generation numbers associated with the pages of a block (e.g., the controller can select the oldest generation number associated with a page of a block as the age of the block). Persons skilled in the art will appreciate that, in addition to or instead of using the age of a block to determine rankings, the controller can use any other suitable rankings to determine a predetermined order for refreshing the multiple portions of the non-volatile memory.

After ranking the blocks, the controller can refresh the multiple portions of the die in an order corresponding to the ranking assigned to each portion. For example, the controller can refresh blocks that include older data (e.g., blocks that may be more susceptible to leakage effects) before blocks that include more recent data.

As another example, the predetermined order may correspond to the physical address of each block of a die. Thus, the controller can refresh the blocks of a die in an order determined by the address of each block. Finally, after refreshing the non-volatile memory at step 312, process 300 may move to step 314 and end.

In some embodiments, in addition to refreshing the non-volatile memory, the controller may select another portion of the non-volatile memory as a new reserved portion. Persons skilled in the art will appreciate that the controller can use any suitable approach to select the new reserved portion including, for example, any of the approaches used to select the original reserved portion (e.g., as discussed previously in step 304 of process 300).

In some embodiments, the controller may select a portion based on a high likelihood that the portion may have data errors due to leakage effects. The likelihood that a portion may have an increased number of data errors may be due to one or more factors, such as, for example, a high number of access operations (e.g., read, program, and erase operations), failure of one or more tests, stored data with an age greater than a particular threshold, and/or any combination thereof.

For example, for a particular die, the controller can monitor the number of erase operations associated with each block of the die. The controller can then determine which block of the die has the highest number of erase operations. Because the block with the highest number of erase operations may be more susceptible to data error, the controller can select this block as the new reserved portion of the die. In another implementation, the controller can monitor sequence counters of multiple blocks of the die. The controller can then select a block with the highest sequence counter as the new reserved portion of the die.

As another example, the controller can select a set of pages as the new reserved portion of a die. For instance, as discussed previously, the controller can perform a test on the memory system. Based on the test, the controller can select a set of pages for the new reserved portion that were determined to be more susceptible to error. As yet another example, the controller can select one or more blocks with the oldest data as the new reserved portion of a die. The one or more blocks, for instance, may be associated with pages corresponding to generation numbers older than a predetermined generation number.

It will be understood that the controller can select the new reserved portion at any suitable time. For example, the controller can select the new reserved portion after the controller has refreshed one or more portions of the non-volatile memory (e.g., after the controller has finished refreshing the non-volatile memory). As another example, the controller can select the new reserved portion before the controller has refreshed any portion of the non-volatile memory.

In some cases, in addition to selecting the new reserved portion, the controller can also refresh the new reserved portion before refreshing any other portion of the non-volatile memory. As a result, the controller can reprogram the new reserved portion as soon as the new reserved portion has been refreshed. For example, as soon as the new reserved portion has been refreshed and prior to refreshing the remaining portions of the non-volatile memory, the controller can store the predetermined pattern into the new reserved portion. By reprogramming the new reserved portion first, the controller can ensure that the new reserved portion has the oldest data in the non-volatile memory, such that the new reserved portion will likely begin to suffer leakage effects first.

In some embodiments, the controller can use a combination of approaches to determine an order for refreshing multiple portions of a non-volatile memory. For example, FIG. 4 shows a flowchart of illustrative process 400 for refreshing multiple portions of a non-volatile memory (e.g., a die of NVM dies 124 or NVM package 120 of FIG. 1, or a die of NVM dies 208, 210, and 212 of FIG. 2) in accordance with various embodiments of the invention. In some embodiments, process 400 may represent a more detailed view of refresh step 312 of process 300 (FIG. 3).

Process 400 may begin at step 402. Then, at step 404, a controller (e.g., host processor 110 and/or NVM controller 122 of FIG. 1) can determine a portion of the non-volatile memory (e.g., one of blocks 202, 204, and 206 of FIG. 2) that has the highest likelihood of data error due to leakage effects. As discussed previously, the likelihood that a portion may have an increased number of data errors may be due to one or more factors, such as, for example, a high number of access operations (e.g., read, program, and erase operations), failure of one or more tests, stored data with an age greater than a particular threshold, and/or any combination thereof.

Continuing to step 406, the controller can select the portion as a new reserved portion of the non-volatile memory. Persons skilled in the art will appreciate that the selected portion of the non-volatile memory can include any suitable portion such as, for example, one or more dies, one or more blocks, one or more pages, any other suitable portion of the non-volatile memory, and/or any combination thereof. After selecting the new reserved portion, process 400 may move to step 408.

At step 408, the controller can refresh the new reserved portion of the non-volatile memory. Then, at step 410, the controller can determine rankings of the remaining portions of the non-volatile memory. For example, as discussed previously, the controller can determine rankings of the remaining portions based on the age of data stored on each portion. For instance, because older data may be more likely to suffer from leakage effects, the controller can determine the rankings based on decreasing age. Persons skilled in the art will appreciate that, in addition to or instead of age, any other suitable rankings can be used by the controller to determine rankings of the remaining portions. After determining the rankings, process 400 may move to step 412.

At step 412, the controller can refresh the remaining portions of the non-volatile memory in an order corresponding to the rankings. For example, the controller can refresh the remaining portions of the non-volatile memory that include older data (e.g., one or more blocks that may be more susceptible to leakage effects) before other portions that include more recent data. After refreshing the remaining portions, process 400 may move to step 414 and end.

In some embodiments, instead of or in addition to refreshing the non-volatile memory, a controller can attempt to distinguish data errors due to leakage effects from data errors due to disturb issues (e.g., read/program/erase disturb issues). For example, FIG. 5 shows a flowchart of illustrative process 500 for distinguishing data errors due to leakage effects from data errors due to disturb issues of a non-volatile memory (e.g., a die of NVM dies 124 or NVM package 120 of FIG. 1, or a die of NVM dies 208, 210, and 212 of FIG. 2) in accordance with various embodiments of the invention.

Process 500 may begin at step 502. Then, at step 504, a controller (e.g., host processor 110 and/or NVM controller 122 of FIG. 1) can determine whether an uncorrectable event has occurred for data stored on a portion of the non-volatile memory (e.g., one of blocks 202, 204, and 206 of FIG. 2). If, at step 504, the controller determines that an uncorrectable event has not occurred, the controller can return to step 504, where the controller can continue to monitor for an uncorrectable event.

If, at step 504, the controller instead determines that an uncorrectable event has occurred, the controller can continue to step 506. At step 506, the controller can attempt to search for portions of the non-volatile memory (e.g., one or more pages or blocks that include user data and/or one or more reserved portions) that include data that are older than the data classified as uncorrectable. In some cases, the controller may search for portions that include older data because older data may be more likely to suffer from leakage effects. After locating the portions of the non-volatile memory with older data, process 500 may move to step 508.

At step 508, the controller can determine whether there are data errors in the older data. If, at step 508, the controller determines that the older data does not include data errors, process 500 may move to step 510. Then, at step 510, the controller can determine that the uncorrectable event is caused by disturb issues.

If, at step 508, the controller instead determines that the older data does include data errors, process 500 may move to step 512. At step 512, the controller may determine that the uncorrectable event is caused by leakage effects. In some cases, in response to determining that the uncorrectable event is caused by leakage effects, the controller may also refresh the non-volatile memory.

Persons skilled in the art will appreciate that by searching for portions of the non-volatile memory that include data older than data that have been classified as uncorrectable, the controller does not necessarily have to monitor a reserved portion of the non-volatile memory in order to refresh the non-volatile memory. Instead, the controller can refresh the non-volatile memory by monitoring portions where the data has deteriorated.

It should be understood that processes 300, 400, and 500 of FIGS. 3-5, respectively, are merely illustrative. Any of the steps may be removed, modified, or combined, and any additional steps may be added, without departing from the scope of the invention.

The described embodiments of the invention are presented for the purpose of illustration and not of limitation.

What is claimed is:

1. A method for distinguishing data errors in a non-volatile memory ("NVM"), the method comprising:
    determining whether an uncorrectable event has occurred for first data stored on a portion of the NVM;
    in response to determining that the uncorrectable event has occurred, searching for other portions of the NVM comprising second data of the NVM that are older than the first data;
    determining whether there are data errors in the second data; and
    in response to determining that there are data errors in the second data, classifying the uncorrectable event as being caused by leakage effects.

2. The method of claim 1, wherein classifying the uncorrectable event as being caused by leakage effects further comprises refreshing the NVM.

3. The method of claim 1, wherein in response to determining that the uncorrectable event has not occurred, continuing to monitor for the uncorrectable event for the first data.

4. The method of claim 1, wherein in response to determining that there are no data errors in the second data, classifying the uncorrectable event has being caused by disturb issues.

5. The method of claim 1, wherein in response to determining that there are no data errors in the second data, classifying the uncorrectable event as being caused by disturb issues.

6. A system comprising:
    a non-volatile memory ("NVM") comprising at least one die with a plurality of portions; and
    a controller for refreshing the NVM, wherein the controller is operative to:
        determine that an uncorrectable event has occurred for data stored on a portion of the plurality of portions;
        search for at least one first portion that is expected to suffer from leakage effects;
        determine whether there is at least one data error in the at least one first portion; and
        in response to determining that there is at least one data error in the at least one first portion, refresh the NVM.

7. The system of claim 6, wherein the at least one first portion comprises one of at least one page of the NVM and at least one block of the NVM comprising user data.

8. The system of claim 6, wherein the at least one first portion comprises at least one reserved portion of the NVM.

9. The system of claim 6, wherein the at least one first portion comprises data that are older than the data stored on the portion of the plurality of portions.

10. The system of claim 6, wherein the controller is operative to classify the uncorrectable event as being caused by leakage effects.

11. The system of claim 6, wherein the controller is operative to:
    monitor at least one second portion of the NVM for storage deterioration over time;
    determine that storage deterioration has occurred in the at least one second portion;
    reprogram data stored in a first block of the NVM to a second block of the NVM; and
    erase the data stored in the first block.

12. The system of claim 11, wherein the at least one second portion is a reserved portion of the NVM.

13. The system of claim 11, wherein the at least one second portion is a portion comprising data that have deteriorated.

14. The system of claim 6, wherein in response to determining that there is not at least one data error in the at least one first portion, the controller is operative to classify the uncorrectable event as being caused by disturb issues.

15. The system of claim 14, wherein the disturb issues comprises at least one of read, program, and erase disturb issues.

* * * * *